(12) United States Patent
Cheng et al.

(10) Patent No.: US 11,553,609 B2
(45) Date of Patent: Jan. 10, 2023

(54) REEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Yapeng Cheng, Hubei (CN); Seungkyu Choi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 30 days.

(21) Appl. No.: 17/057,403

(22) PCT Filed: Jun. 19, 2020

(86) PCT No.: PCT/CN2020/097075
§ 371 (c)(1),
(2) Date: Nov. 20, 2020

(87) PCT Pub. No.: WO2021/248546
PCT Pub. Date: Dec. 16, 2021

(65) Prior Publication Data
US 2022/0192038 A1    Jun. 16, 2022

(30) Foreign Application Priority Data
Jun. 8, 2020    (CN) .......................... 202010510346.1

(51) Int. Cl.
| H05K 7/02 | (2006.01) |
| H05K 7/04 | (2006.01) |
| H05K 5/02 | (2006.01) |
| H05K 5/00 | (2006.01) |

(52) U.S. Cl.
CPC ......... *H05K 5/0217* (2013.01); *H05K 5/0017* (2013.01)

(58) Field of Classification Search
USPC ........................................ 361/807, 809, 810
See application file for complete search history.

(56) References Cited

U.S. PATENT DOCUMENTS

| 2013/0127799 A1 | 5/2013 | Lee |
| 2016/0239052 A1 | 8/2016 | Kim et al. |
| 2017/0060183 A1 | 3/2017 | Zhang et al. |
| 2017/0123461 A1 | 5/2017 | Kim et al. |

(Continued)

FOREIGN PATENT DOCUMENTS

| CN | 104680943 A | 6/2015 |
| CN | 107578706 A | 1/2018 |

(Continued)

*Primary Examiner* — Hung S. Bui
(74) *Attorney, Agent, or Firm* — PV IP PC; Wei Te Chung; Ude Lu

(57) ABSTRACT

A reel and a display device are provided. The display device includes the reel, the reel includes a reel body, and the reel body is cylindrical. The reel body is provided with a first ring mounting groove along an extending direction of a length of a cylinder, and a depth of the first ring mounting groove corresponds to a thickness of a flexible display screen to be mounted.

8 Claims, 7 Drawing Sheets

(56) References Cited

U.S. PATENT DOCUMENTS

| | | | |
|---|---|---|---|
| 2017/0196102 A1* | 7/2017 | Shin | G06F 1/1607 |
| 2017/0325342 A1 | 11/2017 | Lee | |
| 2018/0014414 A1* | 1/2018 | Kim | G06F 1/1652 |
| 2019/0297736 A1* | 9/2019 | Xu | G06F 1/1656 |
| 2020/0029448 A1 | 1/2020 | Kim et al. | |

FOREIGN PATENT DOCUMENTS

| | | |
|---|---|---|
| CN | 208061588 U | 11/2018 |
| CN | 109887419 A | 6/2019 |
| KR | 20170013540 A | 2/2017 |

* cited by examiner

REEL AND DISPLAY DEVICE

FIELD OF INVENTION

The present invention relates to the field of display technologies, and in particular, to a reel and a display device.

BACKGROUND OF INVENTION

At present, people are becoming more and more dependent on electronic products such as mobile phones, tablets, and smart wearable devices. In order to enhance user experience and enhance product competitiveness, use of large screens has become a development trend. Regarding an inconvenience of carrying large-screen electronic equipment, rollable electronic display devices have emerged. A rollable electronic display device can roll an electronic display screen into a reel when not in use and store it in a small size for easy carrying, and when it is in use, pull the electronic display screen out from the reel. With a development of flexible electronic display technologies, research on structures of rollable devices is also underway.

Shown in FIG. 1 is a current display device 90, comprising a reel 91 and a flexible display 92. The reel 91 is a standard cylindrical shape. In order to meet curling requirements, the flexible display 92 is curled on the cylindrical reel 91. With multiple pulls, lifespan of the electronic display 92 is a focus of various display equipment manufacturers and is a key to mass production of display devices.

When the flexible display 92 is rolled into a second circle immediately after a first circle, because there is already a layer of screen attached to the reel 91, and the flexible display 92 has a certain thickness, an overlap of the first circle and the second circle of the flexible display 92 will cause the second circle of the flexible display 92 to bulge, so a sectional difference is formed at the overlap, and a depth of the sectional difference is a thickness of the flexible display 92. Currently, the flexible display screen 92 has serious stress concentration and a local tensile stress rises sharply, which cause the flexible display 92 to fail due to the stress concentration and internal circuit breaks and reduces curling lifespan of rollable display devices.

Technical Problem

An objective of the present invention is to provide a reel and a display device to solve a technical problem: When a flexible display is rolled on a reel, because the flexible display has a certain thickness and is directly attached to the cylindrical reel, an overlap of a first circle and a second circle of the flexible display will cause the second circle of the flexible display to bulge to form a sectional difference at the overlap. Currently, the flexible display screen has serious stress concentration and a local tensile stress rises sharply, which cause the flexible display to fail due to the stress concentration and internal circuit breaks and reduces curling lifespan of rollable display devices.

Technical Solution

In order to achieve the above objective, the present invention provides a reel for mounting a flexible display screen. The reel comprises a reel body, which is cylindrical, wherein the reel body is provided with a first ring mounting groove along an extending direction of a length of a cylinder, a depth of the first ring mounting groove corresponds to a thickness of the flexible display screen to be mounted, when the flexible display screen is wound around the reel body from the first ring mounting groove to an end of a first circle, no sectional difference is created between an inner surface of a second circle and an outer surface of the first circle of the flexible display screen.

Further, the reel body is composed of two half cylinders, a section is formed at a starting position of the first ring mounting groove, and radii of the two half cylinders at two sides of the section are a first radius and a second radius, the second radius is less than the first radius, and a difference between the first radius and the second radius is the thickness of the flexible display screen.

Further, radii of the two half cylinders at an intersection away from the section are equal, when the reel body rotates once from the section, its radius size gradually increases from the second radius to the first radius.

Further, a distance between a center of the first radius and a center of the second radius is equal to half of a thickness of a pre-mounted flexible display screen.

Further, the first radius is less than or equal to 10 mm.

Further, a cross section of the reel body is any one of a circle, an ellipse, or a rectangle with the first ring mounting groove.

Further, a material of the reel body comprises metal or hard plastic.

Further, the reel further comprises a reel housing covering the reel body for receiving the flexible display screen in a curled state.

The present invention further provides a display device, which comprises the reel.

Further, the display device further comprises a flexible display screen disposed on an outer surface of the reel, wherein one end of the flexible display screen is mounted in the first ring mounting groove and wound around the reel body, the depth of the first ring mounting groove corresponds to the thickness of the flexible display screen, and is configured to eliminate a sectional difference of the flexible display screen during a curling process.

Further, the display device further comprises a display support housing connected to the other end of the flexible display screen, wherein a length of the display support housing is less than a length of the flexible display screen.

Beneficial Effect

Advantages of the present invention are: a reel and a display device are provided. The reel is an irregular cylinder, and a display device structure comprises a flexible display screen and the reel. The reel is provided with a first ring mounting groove, and a depth of the first ring mounting groove corresponds to a thickness of the flexible display screen to be mounted. When the flexible display screen is wound around a reel body from the first ring mounting groove to an end of a first circle, no sectional difference is created between an inner surface of a second circle and an outer surface of the first circle of the flexible display screen, which ensures that the flexible display screen does not produce stress concentration during a curling process, reduces a stress value of the flexible display screen during a pulling process, reduces a risk of failure, and improves service life.

REFERENCE NUMERALS SHOWN IN THE DRAWINGS ARE AS FOLLOWS

Figure 1:
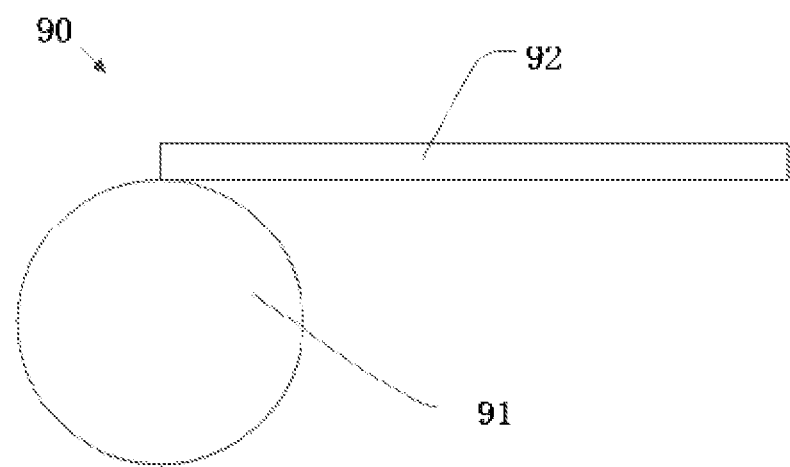
FIG. 1 is a schematic structural view of a conventional display device.

10: reel, 11: reel body, 12: first ring mounting groove, 13: section, 20: flexible display screen, 30: display support housing, 100; display device.

DETAILED DESCRIPTION OF PREFERRED EMBODIMENTS

The following will clearly and completely describe the technical solutions in the embodiments of the present invention with reference to the drawings in the embodiments of the present invention. Obviously, the described embodiments are only a part of the embodiments of the present invention, rather than all the embodiments. Based on the embodiments in the present invention, all other embodiments obtained by those skilled in the art without creative work are within the protection scope of the present invention.

In the description of the present invention, it is to be noted that, unless otherwise expressly provided and limited, the terms "installation," "coupling," "connection" are to be understood broadly. For example, it may be a fixed connection, a detachable connection, or an integral connection; it may be mechanical or electrical or may communicate with each other; it may be a direct connection or an indirect connection through an intermediate medium; it may be a connection within two components or the interaction of two components. Those of ordinary skill in the art can understand the specific meaning of the above terms in the present invention on a case-by-case basis.

In the drawings, thicknesses of layers and regions are exaggerated for clarity. For example, for ease of description, a thickness and size of components in the drawings are arbitrarily shown and, therefore, the scope of the described technology is not limited by the drawings.

Figure 2:
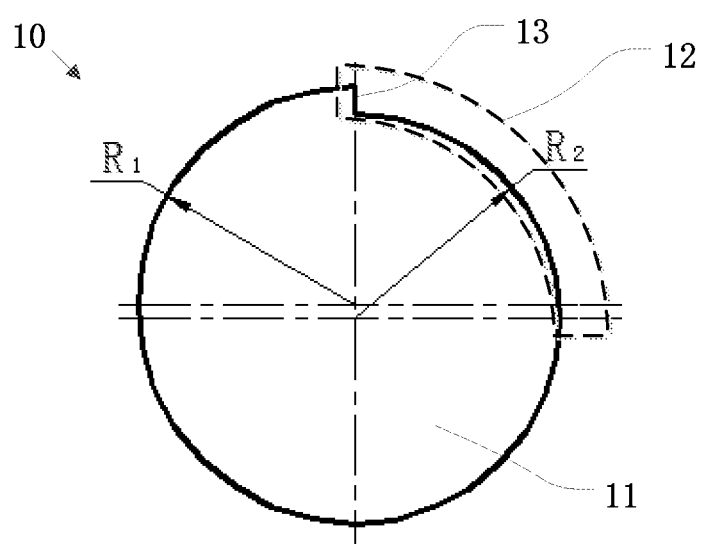
FIG. 2 is a schematic structural view a reel mainly showing a first ring mounting groove in an embodiment of the present invention.
Figure 3:
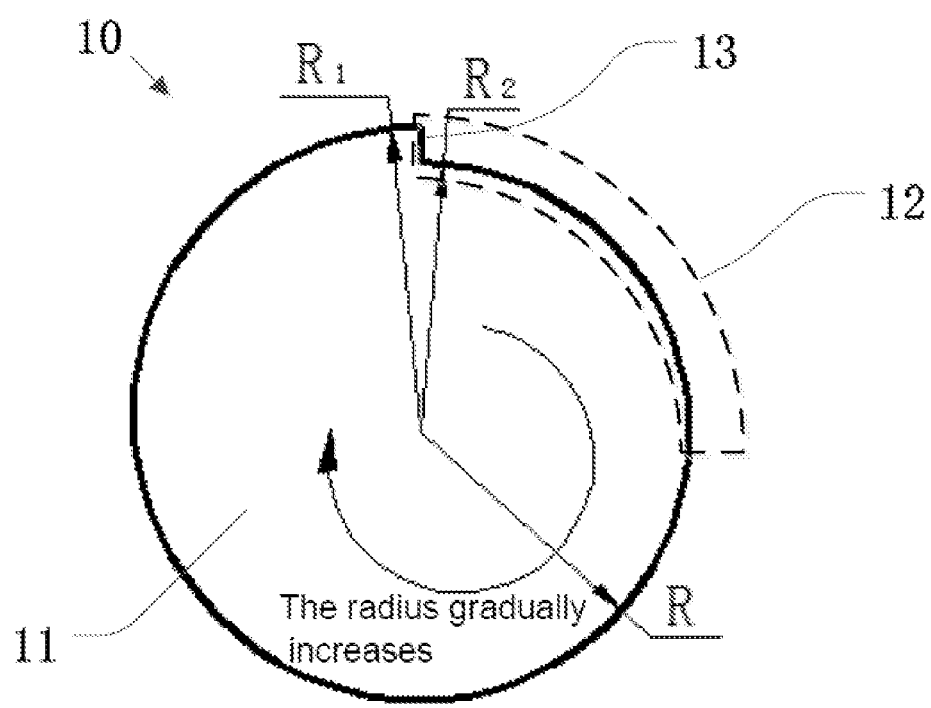
FIG. 3 is a schematic structural view of the reel mainly showing a section in the embodiment of the present invention.

Please refer to FIG. 2 and FIG. 3, an embodiment of the present invention provides a reel 10 comprising a reel body 11, and the reel body 11 is cylindrical. The reel body 11 is provided with a first ring mounting groove 12 along an extending direction of a length of a cylinder, and a depth of the first ring mounting groove 12 corresponds to a thickness of the flexible display screen to be mounted. That is, the depth of the first ring mounting groove 12 is approximately equal to the thickness of the flexible display screen to be mounted. When the flexible display screen is wound around the reel body 11 from the first ring mounting groove 12 to an end of a first circle, no sectional difference is created between an inner surface of a second circle and an outer surface of the first circle of the flexible display screen, which makes the flexible display screen to eliminate a sectional difference during a curling process, ensures that the flexible display screen does not produce stress concentration during the curling process, reduces a stress value of the flexible display screen during a pulling process, reduces a risk of failure, and improves service life.

It is noted that a recommended value of the depth of the first ring mounting groove 12 is a thickness of a pre-mounted flexible screen, and it can also be optimized through numerical calculation to design a best depth value. In other embodiments, the first ring mounting groove 12 may also have other deformed structures with the same function.

Please refer to FIG. 2 and FIG. 3, in the embodiment, the reel body 11 is composed of two half cylinders. A section 13 is formed at a starting position of the first ring mounting groove 12, and radii of the two half cylinders at two sides of the section 13 are a first radius R1 and a second radius R2. The second radius R2 is less than the first radius R1, and a difference between the first radius R1 and the second radius R2 is the thickness of the flexible display screen. It is understandable that a length of the section 13 is the depth of the first ring mounting groove 12, that is, a height difference of the reel body 11.

In the embodiment, radii of the two half cylinders at an intersection away from the section 13 are equal. When the reel body 11 rotates once from the section 13, its radius size gradually increases from the second radius R2 to the first radius R1. That is, an outer surface of the reel body 11 is a smooth curved surface.

In the embodiment, a difference in height between positions of centers of the two half cylinders is equal to half of the thickness of the flexible display screen.

In the embodiment, in order to ensure the portability of carrying thickness, a maximum radius of the reel 10 is not greater than 10 mm. That is, the first radius R1 is less than or equal to 10 mm.

Figure 4:
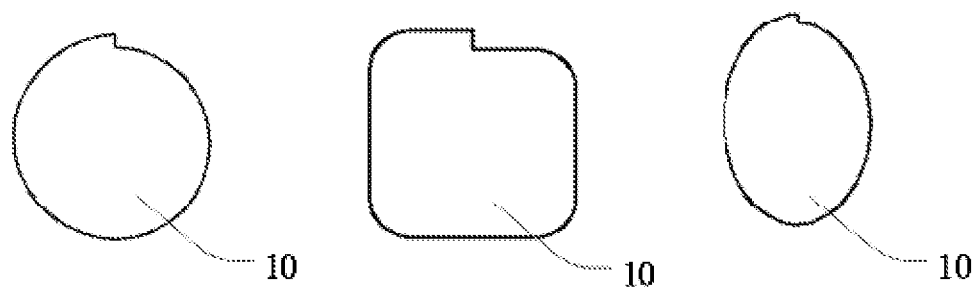
FIG. 4 is a schematic cross-sectional view of the reel in the embodiment of the present invention.

Please refer to FIG. 4, in the embodiment, a cross section of the reel body 11 is any one of a circle, an ellipse, or a rectangle with the first ring mounting groove 12. The rectangle is preferably a square.

In the embodiment, a material of the reel body comprises metal or hard plastic. The metal material is preferably aluminum alloy, stainless steel, etc.

In the embodiment, a structural manufacturing method of the reel body 11 comprises but is not limited to CNC machining, 3D printing, and the like. The reel body 11 can be formed by connecting the two half cylinders, or can be processed by one cylinder, the radius at the largest dimension is R1, and the radius at the smallest dimension is R2.

In the embodiment, the reel 10 further comprises a reel housing (not shown), which covers the reel body 11 for receiving the flexible display screen in a curled state. The reel housing is provided with an opening for unfolding and curling the flexible display screen.

Figure 5:
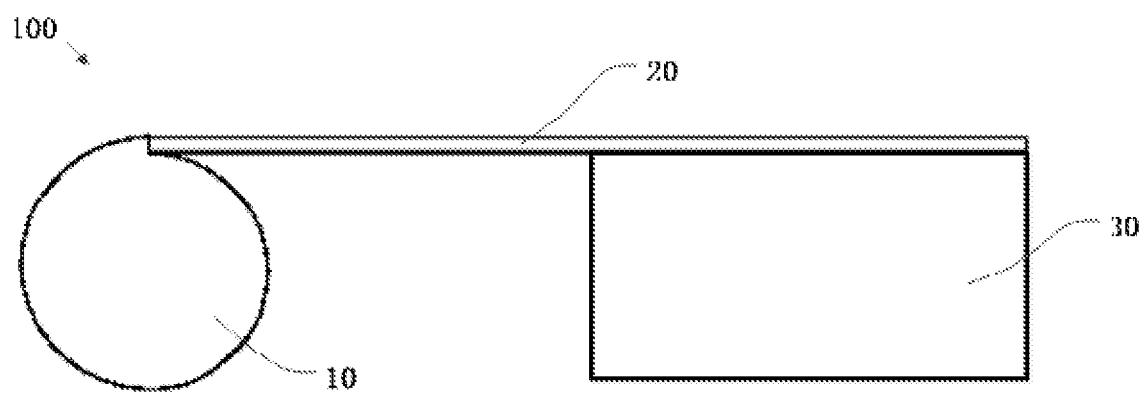
FIG. 5 is a schematic structural view of a display device in an unfolded state in an embodiment of the present invention.
Figure 6:
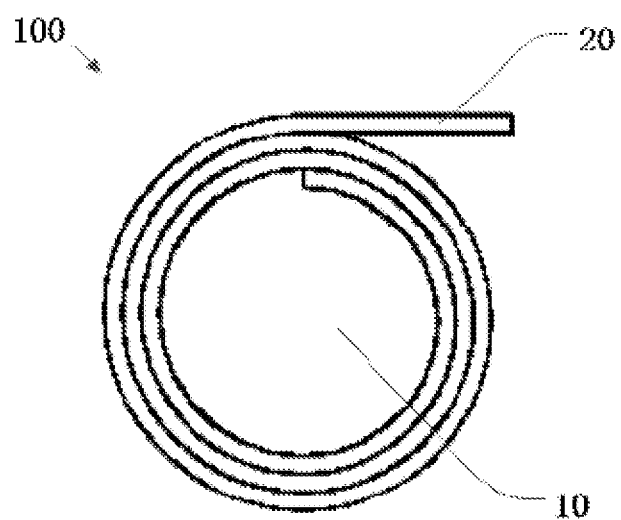
FIG. 6 is a schematic structural view of the display device in a rolled state in the embodiment of the present invention.

Please refer to FIG. 5 and FIG. 6. The present invention further provides a display device 100 comprising the reel 10.

The display device 100 in the embodiment of the present disclosure may be any product or component with a display function, such as a mobile phone, a tablet, a television, a monitor, a notebook, a digital photo frame, a navigator, etc.

Please refer to FIG. 5 and FIG. 6, in the embodiment, the display device 100 further comprises a flexible display screen 20. The flexible display screen 20 is disposed on an outer surface of the reel 10. One end of the flexible display screen 20 is mounted in the first ring mounting groove 12, and the other end is wound around the reel body 11. The depth of the first ring mounting groove 12 corresponds to the thickness of the flexible display screen 20, and is configured to eliminate the sectional difference of the flexible display screen 20 during the curling process. Since the reel 10 is provided with the first ring mounting groove 12, the depth of which is the thickness of the flexible display screen 20, so that the flexible display screen 20 eliminates the sectional difference during the curling process, ensures that the flexible display screen 20 does not produce stress concentration during the curling process, reduces a stress value of the flexible display screen 20 during the pulling process of the display device 100, reduces a risk of failure, and improves service life.

Please refer to FIG. 5 and FIG. 6, in the embodiment, the display device 100 further comprises a display support housing 30. The display support housing 30 is connected to the other end of the flexible display screen 20. a length of the display support housing 30 is less than a length of the flexible display screen 20.

Figure 7:
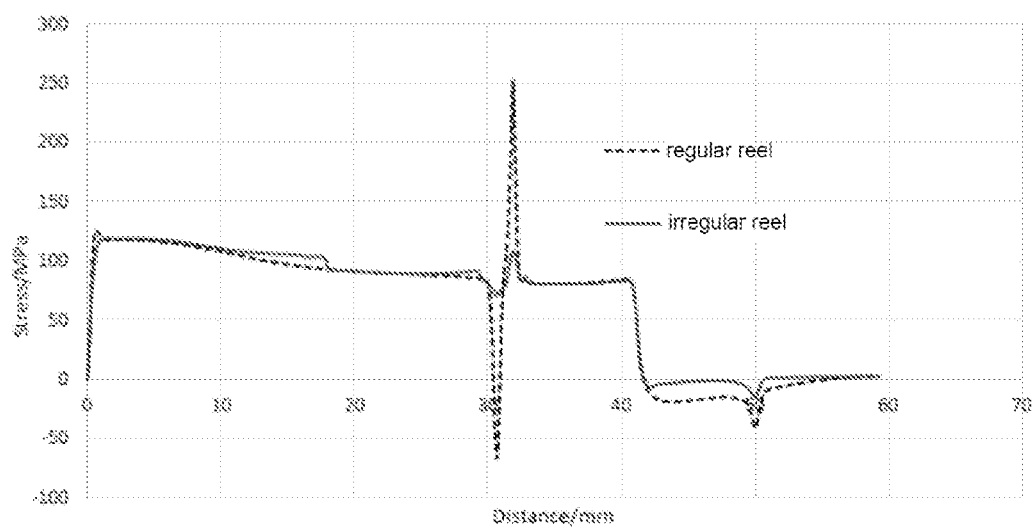
FIG. 7 is a stress comparison diagram between the display device in the embodiment of the present invention and the conventional display device.

Please refer to FIG. 7, which is a stress comparison diagram between the display device in the embodiment of the present invention and the conventional display device. Specifically, the structural stress comparison of FIG. 1 and FIG. 5. In FIG. 7, a result of the display device in the embodiment of the present invention is represented by an irregular reel, and a result of the conventional display device is represented by a regular reel. A calculation of the irregular cylindrical reel structure by finite element software can show that the structure is effective in eliminating stress concentration.

In order to clearly show the stress comparison results, FIG. 7 uses a numerical calculation result of the improvement of the maximum stress of the flexible display screen 20 by the irregular reel structure when the curling radius of the flexible display screen 20 is the fifth circle. It can be clearly seen from FIG. 7 that when the flexible display screen 20 of the present embodiment is on the reel 10, no sectional difference will be formed at the overlap. Currently, the flexible display screen 20 will not produce serious stress concentration, but a small increase in local tensile stress, so that the stress of the flexible display screen 20 will disappear, reduce the risk of failure, ensure that the internal circuit will not break, and increase the service life of the display device.

Advantages of the present invention are: The reel and the display device are provided. The reel is an irregular cylinder, and a display device structure comprises the flexible display screen and the reel. The reel is provided with the first ring mounting groove, and the depth of the first ring mounting groove corresponds to the thickness of the flexible display screen to be mounted. When the flexible display screen is wound around the reel body from the first ring mounting groove to the end of the first circle, no sectional difference is created between the inner surface of the second circle and the outer surface of the first circle of the flexible display screen, which ensures that the flexible display screen does not produce the stress concentration during the curling process, reduces the stress value of the flexible display screen during the pulling process, reduces the risk of failure, and improves the service life.

In the above, various other corresponding changes and modifications can be made according to the technical solutions and technical ideas of the present invention to those skilled in the art, and all such changes and modifications are within the scope of the claims of the present invention.

What is claimed is:

1. A reel for mounting a flexible display screen, comprising:
  a reel body, which is cylindrical, wherein the reel body is provided with a first ring mounting groove along an extending direction of a length of a cylinder, a depth of the first ring mounting groove corresponds to a thickness of the flexible display screen to be mounted, and when the flexible display screen is wound around the reel body from the first ring mounting groove to an end of a first circle, no sectional difference is created between an inner surface of a second circle and an outer surface of the first circle of the flexible display screen,
  wherein the reel body is composed of two half cylinders, a section is formed at a starting position of the first ring mounting groove, radii of the two half cylinders at two sides of the section are a first radius and a second radius, the second radius is less than the first radius, and a difference between the first radius and the second radius is the thickness of the flexible display screen, wherein the first radius is less than or equal to 10 mm.

2. The reel as claimed in claim 1, wherein radii of the two half cylinders at an intersection away from the section are equal, and when the reel body rotates once from the section, its radius size gradually increases from the second radius to the first radius.

3. The reel as claimed in claim 1, wherein a difference in height between positions of centers of the two half cylinders is equal to half of the thickness of the flexible display screen.

4. The reel as claimed in claim 1, wherein a cross section of the reel body is any one of a circle, an ellipse, or a rectangle with the first ring mounting groove.

5. The reel as claimed in claim 1, wherein a material of the reel body comprises metal or hard plastic.

6. A display device, comprising the reel as claimed in claim 1.

7. The display device as claimed in claim 6, further comprising:
  a flexible display screen disposed on an outer surface of the reel, wherein one end of the flexible display screen is mounted in the first ring mounting groove and wound around the reel body, the depth of the first ring mounting groove corresponds to the thickness of the flexible display screen, and is configured to eliminate a sectional difference of the flexible display screen during a curling process.

8. The display device as claimed in claim 7, further comprising:
  a display support housing connected to the other end of the flexible display screen, wherein a length of the display support housing is less than a length of the flexible display screen.

* * * * *